US010950791B2

(12) United States Patent
Lengade et al.

(10) Patent No.: US 10,950,791 B2
(45) Date of Patent: Mar. 16, 2021

(54) APPARATUSES INCLUDING ELECTRODES HAVING A CONDUCTIVE BARRIER MATERIAL AND METHODS OF FORMING SAME

(71) Applicant: MICRON TECHNOLOGY, INC., Boise, ID (US)

(72) Inventors: Swapnil A. Lengade, Boise, ID (US); John M. Meldrim, Boise, ID (US); Andrea Gotti, Pozzo d'Adda (IT)

(73) Assignee: Micron Technology, Inc., Boise, ID (US)

( * ) Notice: Subject to any disclaimer, the term of this patent is extended or adjusted under 35 U.S.C. 154(b) by 225 days.

(21) Appl. No.: 16/039,707

(22) Filed: Jul. 19, 2018

(65) Prior Publication Data
US 2018/0351096 A1    Dec. 6, 2018

Related U.S. Application Data

(62) Division of application No. 14/857,369, filed on Sep. 17, 2015, now Pat. No. 10,062,844, which is a division of application No. 13/776,485, filed on Feb. 25, 2013, now Pat. No. 9,166,158.

(51) Int. Cl.
*H01L 45/00* (2006.01)
*H01L 27/24* (2006.01)

(52) U.S. Cl.
CPC ...... *H01L 45/1608* (2013.01); *H01L 27/2427* (2013.01); *H01L 27/2463* (2013.01); *H01L 45/06* (2013.01); *H01L 45/12* (2013.01); *H01L 45/1233* (2013.01); *H01L 45/1246* (2013.01); *H01L 45/1253* (2013.01); *H01L 45/141* (2013.01); *H01L 45/144* (2013.01)

(58) Field of Classification Search
CPC combination set(s) only.
See application file for complete search history.

(56) References Cited

U.S. PATENT DOCUMENTS

| | | | |
|---|---|---|---|
| 4,845,533 A | 7/1989 | Pryor et al. | |
| 5,414,271 A | 5/1995 | Ovshinsky et al. | |
| 5,714,768 A | 2/1998 | Ovshinsky et al. | |
| 5,920,122 A | 7/1999 | Matsumoto et al. | |
| 7,332,735 B2 | 2/2008 | Campbell | |
| 7,804,083 B2 | 9/2010 | Chen | |
| 8,237,146 B2 | 8/2012 | Kreupl et al. | |

(Continued)

FOREIGN PATENT DOCUMENTS

WO    2013039496 A1    3/2013

OTHER PUBLICATIONS

Int'l Search Report for PCT/US2011/051600 dated Mar. 21, 2013, pp. all.

(Continued)

*Primary Examiner* — Marvin Payen
(74) *Attorney, Agent, or Firm* — Dorsey & Whitney LLP

(57) ABSTRACT

Apparatuses and methods of manufacture are disclosed for phase change memory cell electrodes having a conductive barrier material. In one example, an apparatus includes a first chalcogenide structure and a second chalcogenide structure stacked together with the first chalcogenide structure. A first electrode portion is coupled to the first chalcogenide structure, and a second electrode portion is coupled to the second chalcogenide structure. An electrically conductive barrier material is disposed between the first and second electrode portions.

20 Claims, 7 Drawing Sheets

(56) References Cited

U.S. PATENT DOCUMENTS

| | | |
|---|---|---|
| 8,263,455 B2 | 9/2012 | Park et al. |
| 8,530,875 B1 | 9/2013 | Chang et al. |
| 9,029,826 B2 | 5/2015 | Chang et al. |
| 9,166,158 B2 | 10/2015 | Lengade et al. |
| 10,062,844 B2 | 8/2018 | Lengade et al. |
| 10,069,069 B2 | 9/2018 | Lengade et al. |
| 10,217,936 B2 | 2/2019 | Lengade et al. |
| 2004/0037179 A1 | 2/2004 | Lee |
| 2005/0023581 A1 | 2/2005 | Nuetzel et al. |
| 2006/0091492 A1 | 5/2006 | Lee et al. |
| 2006/0237756 A1 | 10/2006 | Park et al. |
| 2006/0246712 A1 | 11/2006 | Kim et al. |
| 2006/0255328 A1 | 11/2006 | Dennison |
| 2007/0096090 A1 | 5/2007 | Dennison |
| 2007/0158698 A1 | 7/2007 | Dennison et al. |
| 2007/0210296 A1 | 9/2007 | Cote et al. |
| 2008/0020508 A1 | 1/2008 | Dennison |
| 2008/0067486 A1 | 3/2008 | Karpov et al. |
| 2008/0102560 A1 | 5/2008 | Hamamjy et al. |
| 2008/0121862 A1 | 5/2008 | Liu |
| 2008/0137262 A1 | 6/2008 | Mahalingam et al. |
| 2008/0142984 A1 | 6/2008 | Chen |
| 2009/0014705 A1 | 1/2009 | Hsu et al. |
| 2009/0050872 A1 | 2/2009 | Kuo et al. |
| 2009/0122588 A1 | 5/2009 | Chen |
| 2009/0194758 A1 | 8/2009 | Chen |
| 2009/0218557 A1 | 9/2009 | Sato |
| 2009/0246952 A1 | 10/2009 | Ishizaka et al. |
| 2009/0298222 A1 | 12/2009 | Lowrey et al. |
| 2009/0298224 A1 | 12/2009 | Lowrey |
| 2010/0163818 A1 | 7/2010 | Lee et al. |
| 2011/0007545 A1 | 1/2011 | Jin et al. |
| 2011/0147695 A1 | 6/2011 | Lee et al. |
| 2012/0032638 A1 | 2/2012 | Xu |
| 2012/0224413 A1 | 9/2012 | Zhang et al. |
| 2013/0256624 A1 | 10/2013 | Kau |
| 2013/0344676 A1 | 12/2013 | Chang et al. |
| 2014/0239245 A1 | 8/2014 | Lengade et al. |
| 2016/0005967 A1 | 1/2016 | Lengade et al. |
| 2018/0130948 A1 | 5/2018 | Lengade et al. |
| 2018/0331285 A1 | 11/2018 | Lengade et al. |
| 2018/0331286 A1 | 11/2018 | Lengade et al. |
| 2018/0331287 A1 | 11/2018 | Lengade et al. |
| 2018/0351097 A1 | 12/2018 | Lengade et al. |

OTHER PUBLICATIONS

Park, et al., "Comparison of TiN and TiN/Ti/TiN multilayer Films for Diffusion Barrier Applications", Journal of the Korean Physical Society vol. 42, No. 6, Jun. 2003, pp. 817-820.

U.S. Appl. No. 16/039,769 titled "Apparatuses Including Electrodes Having a Conductive Barrier Material and Methods of Forming Same" filed Jul. 19, 2018, pp. all.

U.S. Appl. No. 16/040,515 titled "Apparatuses Including Electrodes Having a Conductive Barrier Material and Methods of Forming Same" filed Jul. 19, 2018, pp. all.

U.S. Appl. No. 16/040,521 titled "Apparatuses Including Electrodes Having a Conductive Barrier Material and Methods of Forming Same" filed Jul. 19, 2018, pp. all.

U.S. Appl. No. 16/045,550 titled "Apparatuses Including Electrodes Having a Conductive Barrier Material and Methods of Forming Same" filed Jul. 25, 2018, pp. all.

APPARATUSES INCLUDING ELECTRODES HAVING A CONDUCTIVE BARRIER MATERIAL AND METHODS OF FORMING SAME

CROSS REFERENCE TO RELATED APPLICATIONS

This application is a divisional of pending U.S. patent application Ser. No. 14/857,369 filed Sep. 17, 2015 and issued as U.S. Pat. No. 10,062,844 issued Aug. 28, 2018, which is a divisional of U.S. patent application Ser. No. 13/776,485 filed Feb. 25, 2013 and issued as U.S. Pat. No. 9,166,158 on Oct. 20, 2015. The aforementioned applications and issued patents are incorporated herein by reference, in their entirety, for any purpose.

TECHNICAL FIELD

Embodiments of the invention relate generally to integrated circuits, and more particularly, in one or more of the illustrated embodiments, to electrode structures for phase change memory cells that include a conductive barrier material for phase change memory cells, for example.

BACKGROUND OF THE INVENTION

Many advancements have contributed to a recent surge in phase change memory development. With reference to FIG. 1, one recent improvement that has resulted in a simplified and lower cost method of manufacturing phase change memory cells is the inclusion of a switch 124, such as a selectable diode or an ovonic threshold switch, together with a phase change memory storage element 122 in a stacked memory cell 120 of an apparatus 100. Adding the switch 124 within each stacked memory cell 120 eliminates the need to form a transistor switch in the semiconductor substrate below or above each respective memory cell 120.

In order to prevent heat transfer between the phase change memory storage element 122 and the switch 124, however, a thermally insulative electrode 130 such as carbon is typically positioned between the phase change memory storage element 122 and the switch 124. The carbon electrode 130 provides good electrical conductivity (for voltages and currents to pass through), but inhibits the transfer of thermal energy between the phase change memory storage element 122 and the switch 124. The carbon electrode 130 may also serve as a diffusion barrier to prevent diffusion of materials between the phase change memory storage element 122 and the switch 124 during manufacture and operation of the memory cell 120.

Some manufacturing processes of depositing the carbon 130 (or other material), such as physical vapor deposition (PVD), may cause the carbon 130 to form in a columnar manner. Such a columnar carbon electrode 130, however, provides a poor diffusion barrier because the columnarity allows various materials to diffuse across the electrode 130. For example, oxygen, indium, selenium, and so forth may diffuse from the phase change memory storage element 122 to the switch 124, or vice versa, during manufacturing—for example during deposition, etching, thermal cycling and annealing, and/or electrical cycling—or during operation of a finished and packaged memory device. This diffusion of various materials across the electrode 130 may lead to degradation and, eventually, to premature failure of a memory device.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. Furthermore, the drawings provided herein are not necessarily drawn to scale, including the thicknesses of the various layers relative to one another. Also, relative and directional references (e.g., above, below, etc.) are given by way of example to aid the reader's understanding of the particular embodiments described herein, and should not be read as requirements or limitations unless specifically set forth in the claims.

Figure 2:
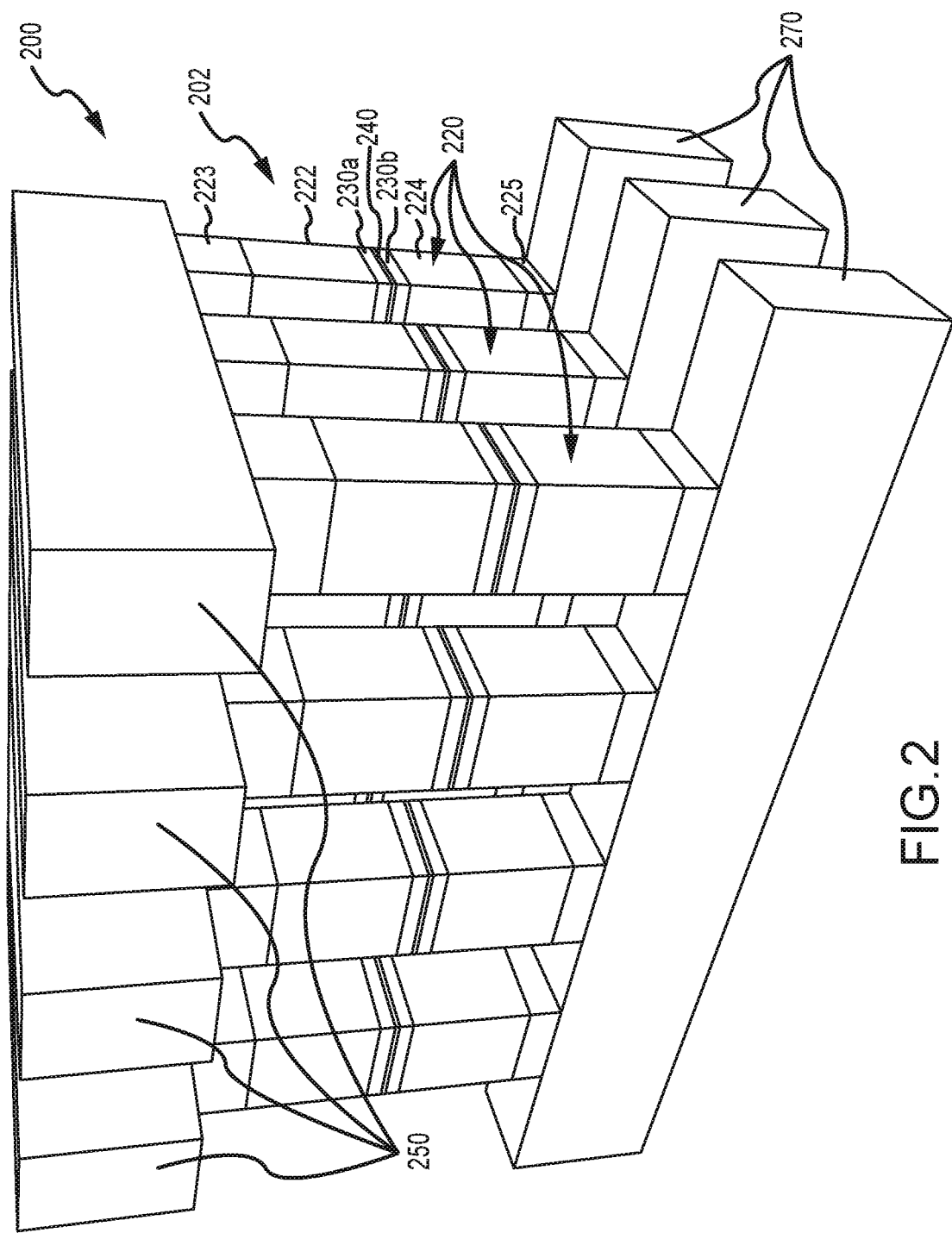
FIG. 2 is a perspective view of a plurality of phase change memory cells according to an embodiment of the present invention.

FIG. 2 illustrates an apparatus 200 including an array 202 of phase change memory cells 220 according to an embodiment of the invention. As used herein, apparatus may refer to, for example, an integrated circuit, a memory device, a memory system, an electronic device or system, a smart phone, a tablet, a computer, a server, etc. Each of the memory cells 220 in the apparatus 200 includes a phase change device 222 and a switch 224, both of which may be chalcogenide structures. For example, in one embodiment, the phase change device 222 may be a phase change storage element that is configured to store one or more bits of data based on the phase (e.g., amorphous, partially crystalline, crystalline, etc.) and thus the electrical resistance of a chalcogenide material. The switch 224 may be a selectable diode or ovonic threshold switch, and may be configured to allow read and/or program access to the phase change device 222. In another embodiment, additional phase change devices (not illustrated in FIG. 2) or chalcogenide structures may be included within each stacked memory cell 220. Also, although the phase change device 222 is illustrated as being above the switch 224 in FIG. 2, in other embodiments, the phase change device 22 may be positioned below the switch 224.

Both of the phase change device 222 and the switch 224 may include a portion of chalcogenide glass, such as GeSbTe, which may be changed between any number of amorphous, partially crystalline, and/or crystalline states depending on voltages and/or currents provided to the phase change device 222 and the switch 224. Also, both of the phase change device 222 and the switch 224 are integrally formed within each memory cell 220, or in other words, both of the phase change device 222 and the switch 224 are stacked together in each memory cell 220, as opposed to having a switch formed underneath or above the memory cell 220 for example.

The memory array 202 includes a plurality of access lines 250, 270, and each memory cell 220 includes a plurality of access line electrodes 223, 225 configured to couple the memory cells 220 to the plurality of access lines 250, 270. A first set of access lines 250 may be bit lines operable to select individual bits within words of the array 202. Each memory cell 220 may include a first access line electrode 223 between the phase change device 222 and a respective one of the first set of access lines 250. A second set of access lines 270 may be wordlines operable to select one or more bits within individual words of the array 202. Each memory cell 220 may include a second access line electrode 225 between the switch 224 and a respective one of the second set of access lines 270. Together, the two sets of access lines 250, 270, and the respective electrodes 223, 225 on each of the memory cells 220 provide the electrical coupling for access control circuitry (not illustrated in FIG. 2) to read and program the memory cells 220.

Each of the access lines 250, 270 may be formed of an electrically conductive material, such as copper, aluminum, polysilicon, and so forth. The access lines 250, 270 may also be comprised of titanium, tungsten, a nitride of titanium or tungsten, or some combination of these. Each of the electrodes 223, 225 may be formed of an electrically conductive material and/or a thermally insulative material. In some examples, the electrodes 223, 225 may be formed from carbon and may couple the memory cells to the respective access lines 250, 270.

Each memory cell also includes one or more electrode portions 230$a$, 230$b$ positioned between the phase change device 222 and the switch 224. Each electrode portion 230$a$, 230$b$ may be between approximately 5-150 ångströms (Å) thick in some embodiments.

With reference to FIG. 2, a first electrode portion 230$a$ may be disposed between the phase change device 222 and the switch 224 proximate the phase change device 222, and a second electrode 230$b$ may be disposed between the switch 224 and the phase change device 222 proximate the switch 224. The first and second electrode portions 230$a$, 230$b$ may in some instances be referred to as first and second electrodes 230$a$, 230$b$, or as first and second electrode portions 230$a$, 230$b$ of the same electrode which are separated by an intermediary barrier material 240 as explained in more detail below. That is, an electrode may include the first and second electrode portions 230$a$, 230$b$ and the intermediary barrier material 240.

The first and second electrode portions 230$a$, 230$b$ (or the first and second electrodes 230$a$, 230$b$) disposed between the phase change device 222 and the switch 224 may provide electrical conductivity and thermal insulation between the phase change device 222 and the switch 224. For example, the first and second electrode portions 230$a$, 230$b$ may in some embodiments have a thermal conductivity between approximately 0.5-10 Wm$^{-1}$K$^{-1}$ in some examples, and may have an electrical resistivity of between 1-100 Ohm-cm as deposited (and 5-50 milliOhm-cm after a high temperature anneal) in some examples. The electrical conductivity provided by the first and second electrode portions 230$a$, 230$b$ may allow electrical voltages and currents to pass between the phase change device 222 and the switch 224 in order to, for example, read and/or program one or both of the phase change device 222 and/or the switch 224. The thermal insulation provided by the first and second electrode portions 230$a$, 230$b$ may help prevent heat from passing through the electrode portions 230$a$, 230$b$, in order to inhibit heat used in reading and/or programming one of the phase change device 222 and/or the switch 224 from being transferred to the other of the phase change device 222 and/or the switch 224.

The electrode portions 230$a$, 230$b$ may further provide a diffusion barrier between the phase change device 222 and the switch 224, as described above. However, in some cases, one or more of the electrode portions 230$a$, 230$b$ may have a columnar structure that reduces the effectiveness of the electrode portions 230$a$, 230$b$ as a diffusion barrier. Thus, with reference to FIG. 2, a barrier material 240 that is electrically conductive may be disposed between the first and second electrode portions 230$a$, 230$b$ in some examples to help strengthen the diffusion barrier.

The electrically conductive barrier material 240 may provide electrical conductivity between the first and second electrode portions 230$a$, 230$b$, and therefore also between the phase change device 222 and the switch 224. The electrically conductive material 240 may or may not be thermally insulative. The electrically conductive material 240 may not change the thermally insulative properties and behavior of the first and second electrode portions 230$a$, 230$b$—in other words, the electrically conductive barrier material 240 may not alter the thermal insulation provided by the first and second electrode portions 230$a$, 230$b$ between the phase change device 222 and the switch in some embodiments.

The electrically conductive barrier material 240 may not be reactive to the electrode portions 230$a$, 230$b$ (which may be formed of carbon) in some examples. For example, titanium nitride (TiN), Tungsten suicide (WSi$_x$), silicon (Si), or combinations thereof may be used in the electrically conductive barrier material 240 in some embodiments. TiN, if used, may have a resistivity of approximately 75-300 µOhm-cm and may have a thermal conductivity of approximately 30 Wm$^{-1}$K$^{-1}$. WSi$_x$, if used, may have a resistivity of approximately 400-1000 µOhm-cm and may have a thermal conductivity of approximately 15 Wm$^{-1}$K$^{-1}$, if used, may have a resistivity of approximately 50-100 Ohm-cm (when undoped) and may have a thermal conductivity of approximately 149 Wm$^{-1}$K$^{-1}$. When Si is used in the electrically conductive barrier material 240, it may be doped Si (e.g., it may be doped with boron, which may not be activated). While Si does provide for electrical conductivity, it may only be semiconductive in some examples, depending on the dopant and doping concentration. In some embodiments, the electrically conductive barrier material 240 may not include any type of dielectric material (e.g., oxide). In other examples, however, the electrically conductive barrier material 240 may react to one or more electrode portions 230$a$, 230$b$.

The electrically conductive barrier material 240 may be relatively thin—it may be, for example, between 5 and 50 ångströms (Å) thick. In some embodiments, the thickness of the electrically conductive barrier material 240 may be 5 Å, 10 Å, 30 Å, 45 Å, 50 Å, and so forth.

The electrically conductive barrier material 240 may be deposited amorphously in some embodiments, and/or may be amorphous during operation of the apparatus 200. The amorphous nature of the electrically conductive barrier material 240 may help strengthen the diffusion barrier between the phase change device 222 and the switch 224 because it mitigates the columnar structure of the electrode portions 230a, 230b. In other words, the electrically conductive barrier material 240 helps prevent diffusion between the phase change device 222 and the switch 224 because it "breaks" any columnarity or columnar growth of the first and/or second electrode portions 230a, 230b (e.g., by causing the columns to not be aligned), thereby reducing the diffusion pathways through the first and/or second electrode portions 230a, 230b. In this manner, even if an element such as indium diffuses from one of the phase change device 222 or the switch 224 into the columns of one of the electrode portions 230a, 230b, the diffusing material will be stopped or at least significantly hindered from passing all the way through to the other of the phase change device 222 or the switch 224 because of the barrier provided by the electrically conductive barrier material 240. As a result, fewer materials may diffuse between the phase change device 222 and the switch 224, which may lead to increased reliability and increased lifespan of the apparatus 200 in some examples.

In other embodiments, however, the electrically conductive barrier material 240 may be at least partially crystalline (e.g., TiN may be at least partially crystalline). In these embodiments, the grain boundaries of the electrically conductive barrier material 240 may not line up with the grain boundaries of the first and second electrode portions 230a, 230b, in order to help prevent diffusion between the phase change device 222 and the switch 224. In these embodiments where the electrically conductive barrier material 240 is at least partially crystalline, the electrically conductive barrier material 240 may have a substantially different crystalline structure than the first and second electrode portions 230a, 230b.

Still referring to FIG. 2, in some embodiments, the phase change device 222 and the switch 224, together with the first and second electrode portions 230a, 230b, and the electrically conductive barrier material 240 may define a stacked memory cell 220, which may have a substantially uniform cross section (e.g., within the stacked memory cell 220, no one portion 'sticks out' from the stack any more than any of the other portions). In other examples, however, one or more of the phase change device 222, the switch 224, the first and second electrode portions 230a, 230b, and the electrically conductive barrier material 240 may have different cross sectional shapes and/or areas. For example, the electrically conductive barrier material 240 may have a larger cross section than the first and/or second electrode portions 230a, 230b and may thus ensure complete partitioning of the first and second electrode portions 230a, 230b from each other in order to provide a strong diffusion barrier.

Figure 1:
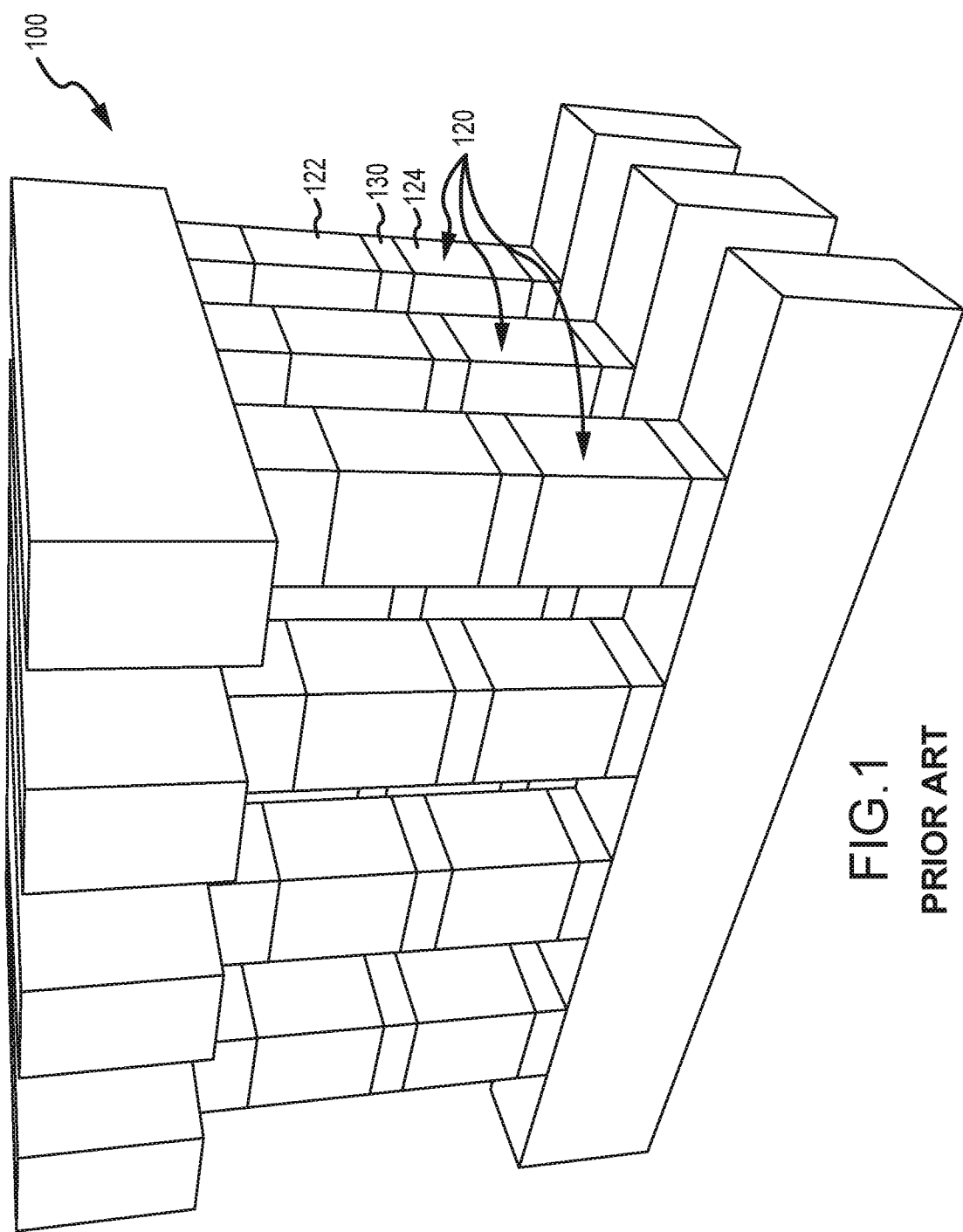
FIG. 1 is a perspective view of a plurality of phase change memory cells according to the prior art.

Comparing now FIG. 2 with FIG. 1, the combined thickness of the first and second electrode portions 230a, 230b together with the electrically conductive barrier material 240 in FIG. 2 may be approximately the same as the thickness of the electrode 130 in FIG. 1 in some examples. Also the combined resistance of the first and second electrode portions 230a, 230b together the electrically conductive barrier material 240 in FIG. 2 may be approximately the same as the resistance of the electrode 130 in FIG. 1 in some examples. In other examples, and as explained in more detail below, the overall thickness and/or the resistance of the first and second electrode portions 230a, 230b and the electrically conductive barrier material 240 in FIG. 2 may be different than the thickness and/or resistances of the electrode 130 in FIG. 1.

In operation, the apparatus 200 selectively provides control signals to the two sets of access lines 250, 270 in order to read and/or program one or both of the phase change device 222 and/or the switch 224 of the memory cells, similar to the operation of the apparatus 100 illustrated in FIG. 1. However, because the diffusion barrier between the phase change device 222 and the switch 224 of some or all of the memory cells 220 has been strengthened by the electrically conductive barrier material 240, fewer or no materials may diffuse across the phase change device 222 and the switch 224 during manufacturing—for example during deposition, etching, thermal cycling and annealing, and/or electrical cycling—or during operation of a finished and packaged memory device, thereby improving the reliability and usable life of the apparatus 200.

Figure 3:
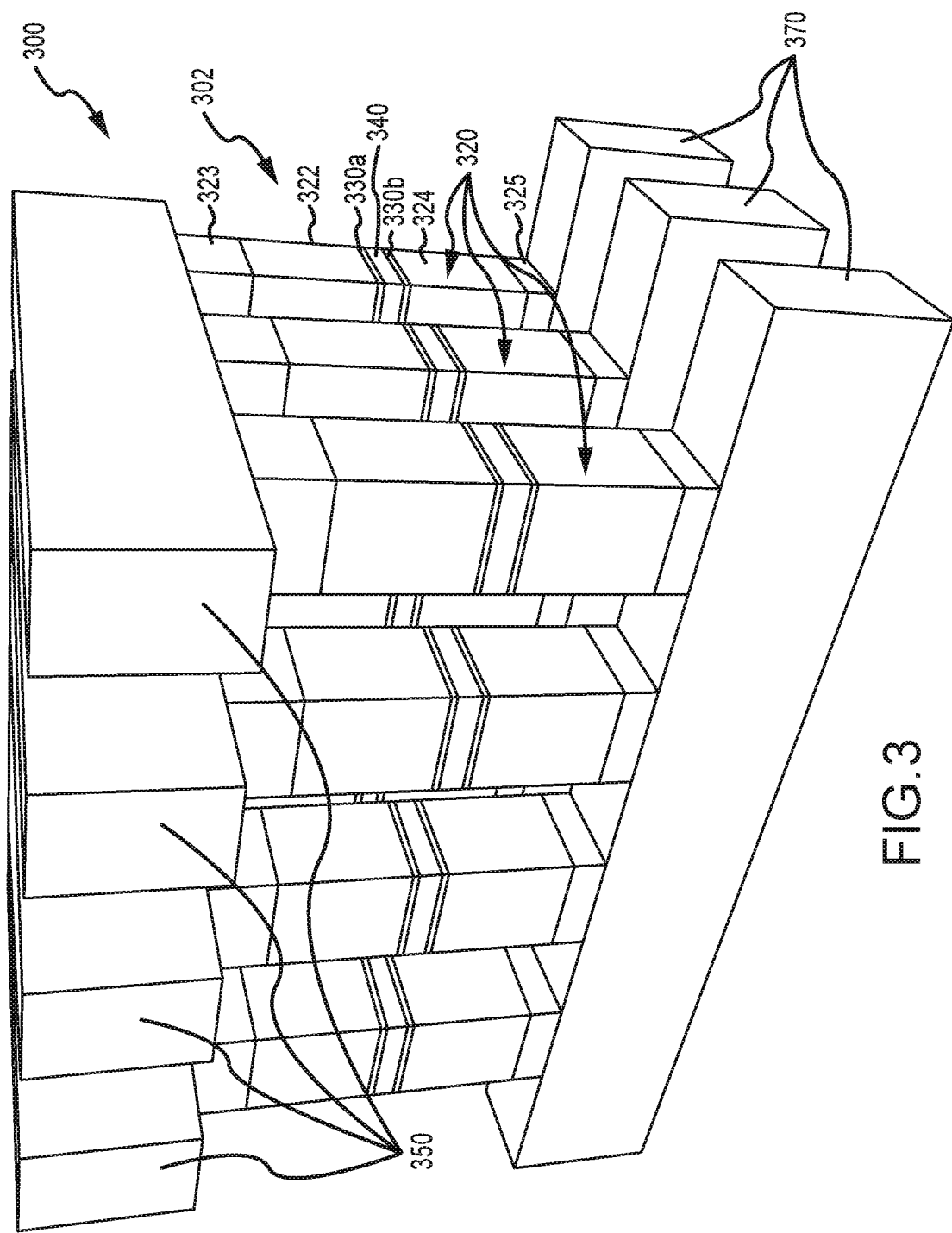
FIG. 3 is a perspective view of a plurality of phase change memory cells according to an embodiment of the present invention.

FIG. 3 illustrates an apparatus 300 including an array 302 of phase change memory cells 320 according to an embodiment of the invention. The apparatus 300 illustrated in FIG. 3 may generally be similar to the apparatus 200 illustrated in FIG. 2 (and like reference numerals may refer to similar elements), but the electrically conductive barrier material 340 in FIG. 3 is thicker than the electrically conductive barrier material 240 illustrated in FIG. 2. Providing a thicker electrically conductive barrier material 340 as illustrated in FIG. 3 may provide an even stronger diffusion barrier because if, for example, the electrically conductive material 340 is amorphous, the thicker barrier material 340 provides an even thicker structure through which diffusing materials would have to pass through in order to successfully diffuse from one of the phase change device 322 and the switch 324 to the other. Depending on the material or materials used for the electrically conductive barrier material 340, the thicker barrier material 340 may also provide for different resistivities of the material 340. In some embodiments, and as illustrated in FIG. 3, the first and second electrode portions 330a, 330b may be thinner in order to maintain the same overall thickness of the two electrode portions 330a, 330b together with the electrically conductive material 340 as compared with FIG. 2, whereas in other embodiments, the electrode portions 330a, 330b may not be thinner and the overall thickness of the two electrode portions 330a, 330b together with the electrically conductive material 340 may be greater than in FIG. 2. In general, the thicknesses of the first and second electrode portions 330a, 330b and the thickness of the electrically conductive barrier material 340 may vary from one embodiment to another, and need not necessarily be the same and the overall thickness of the two electrode portions 330a, 330b together with the electrically conductive material 340 need not be the same amongst different embodiments either.

Figure 4:
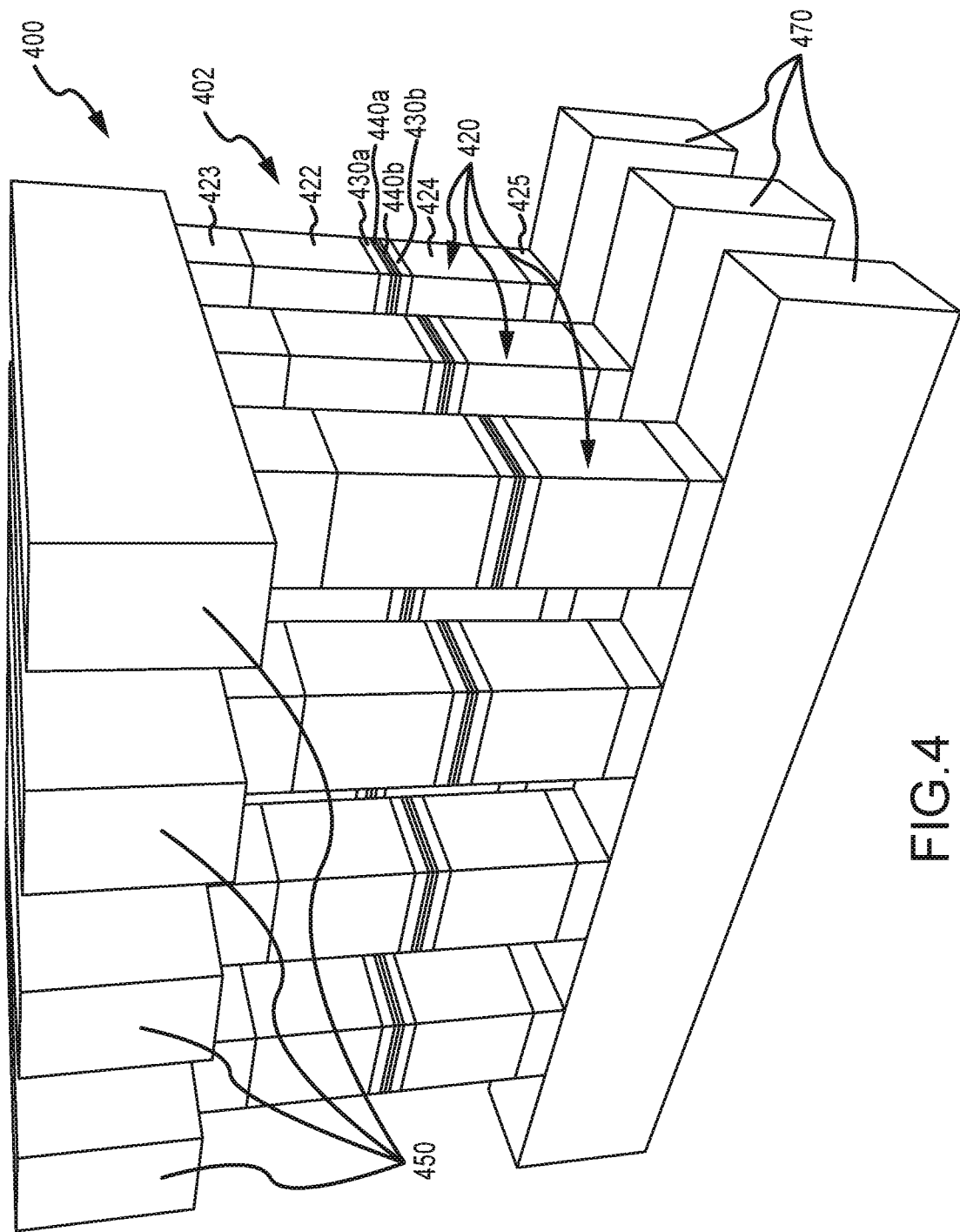
FIG. 4 is a perspective view of a plurality of phase change memory cells according to an embodiment of the present invention.
Figure 5:
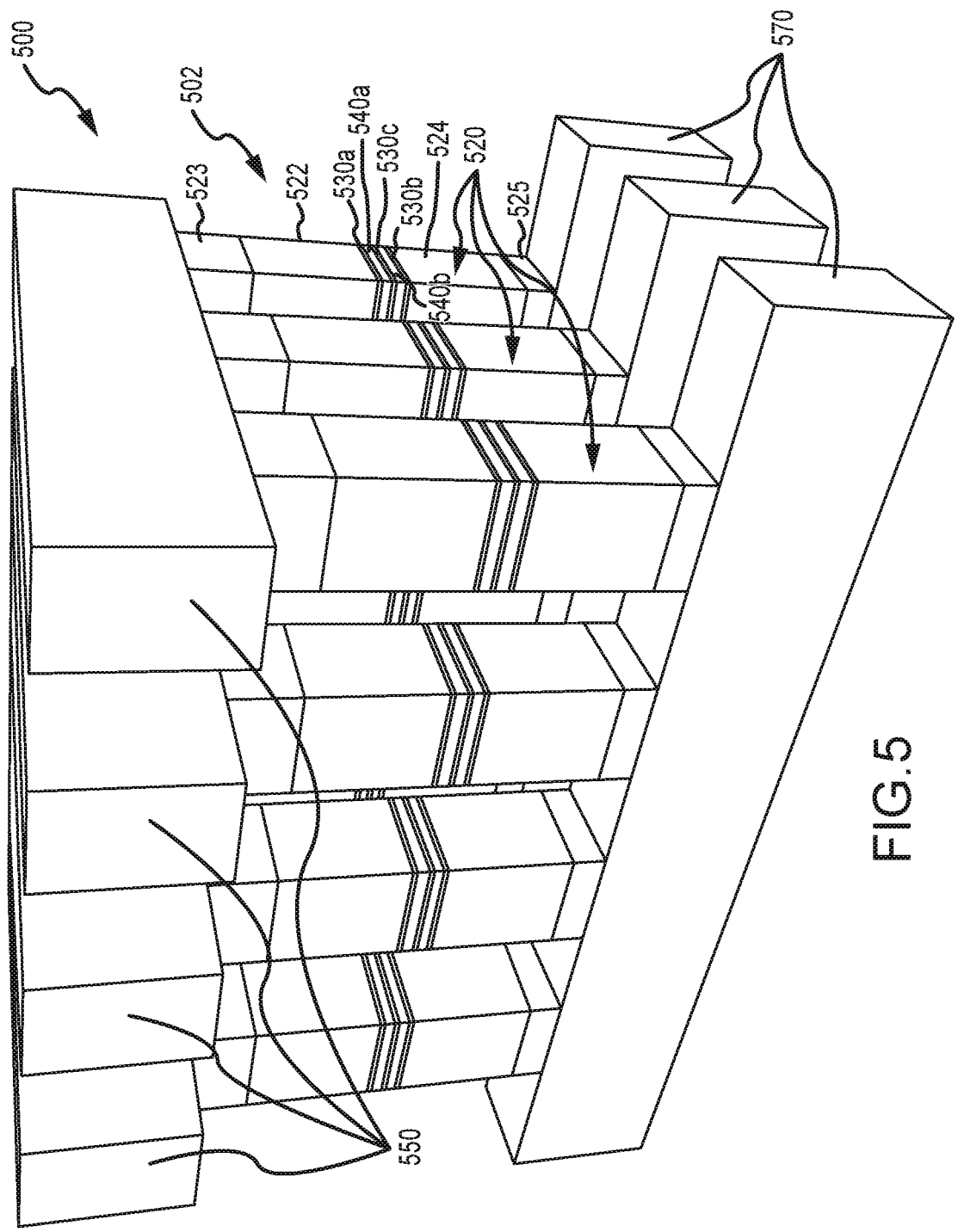
FIG. 5 is a perspective view of a plurality of phase change memory cells according to an embodiment of the present invention.

FIGS. 4 and 5 illustrate apparatuses 400, 500 including an array 402, 502 of phase change memory cells 420, 520 according to embodiments of the invention. The apparatus 400 illustrated in FIG. 4 may generally be similar to the apparatus 200 illustrated in FIG. 2 (and like reference numerals may refer to similar elements), but whereas a single continuous portion of electrically conductive barrier material 240 is disposed between the first and second electrode portions 230a, 230b in FIG. 2, two, discontinuous portions 440a, 440b of electrically conductive barrier material may be disposed between the first and second electrode portions 430a, 430b in some embodiments as illustrated in FIG. 4. In other words, the single portion of electrically conductive barrier material 240 in FIG. 2 may be partitioned into a plurality of portions to form the barrier material portions 440a, 440b in FIG. 4. In general, any number of portions (e.g., 440a, 440b) of electrically conductive material may be used, such as 2, 3, 4, 5 or more. The portions 440a, 440b may be formed from similar or different materials. For example, both portions 440a, 440b may include TiN, or the first portion 440a may include TiN while the second portion 440b may include Si. The two portions 440a, 440b may be formed together in situ, one after the other (e.g., deposited without an air break), or one of the portions 440a may be formed after some sort of break during manufacturing.

In some examples, the two discontinuous portions of electrically conductive barrier material 440a, 440b may be contiguous to one another (e.g., separate, but touching), whereas in other embodiments, and with reference to FIG. 5, the first and second portions of electrically conductive barrier material 540a, 540b may be separated by a third electrode 530c. In other words, a third electrode 530c may be disposed between the first and second electrode portions 530a, 530b, and further disposed between the two discontinuous portions 540a, 540b of electrically conductive barrier material.

While FIG. 3 illustrates two electrode portions 330a, 330b and a single portion of electrically conductive barrier material 340, and FIG. 4 illustrates two electrode portions 430a, 430b and two portions of electrically conductive barrier material 340a, 340b, and FIG. 5 illustrates three electrode portions 530a, 530b, 530c and two portions of electrically conductive barrier material 540a, 540b, it will be understood that any number of electrodes (or portions of electrodes) may be used together with any number of portions of electrically conductive barrier material in order to obtain a desired operation for any given memory cell.

Figure 6:
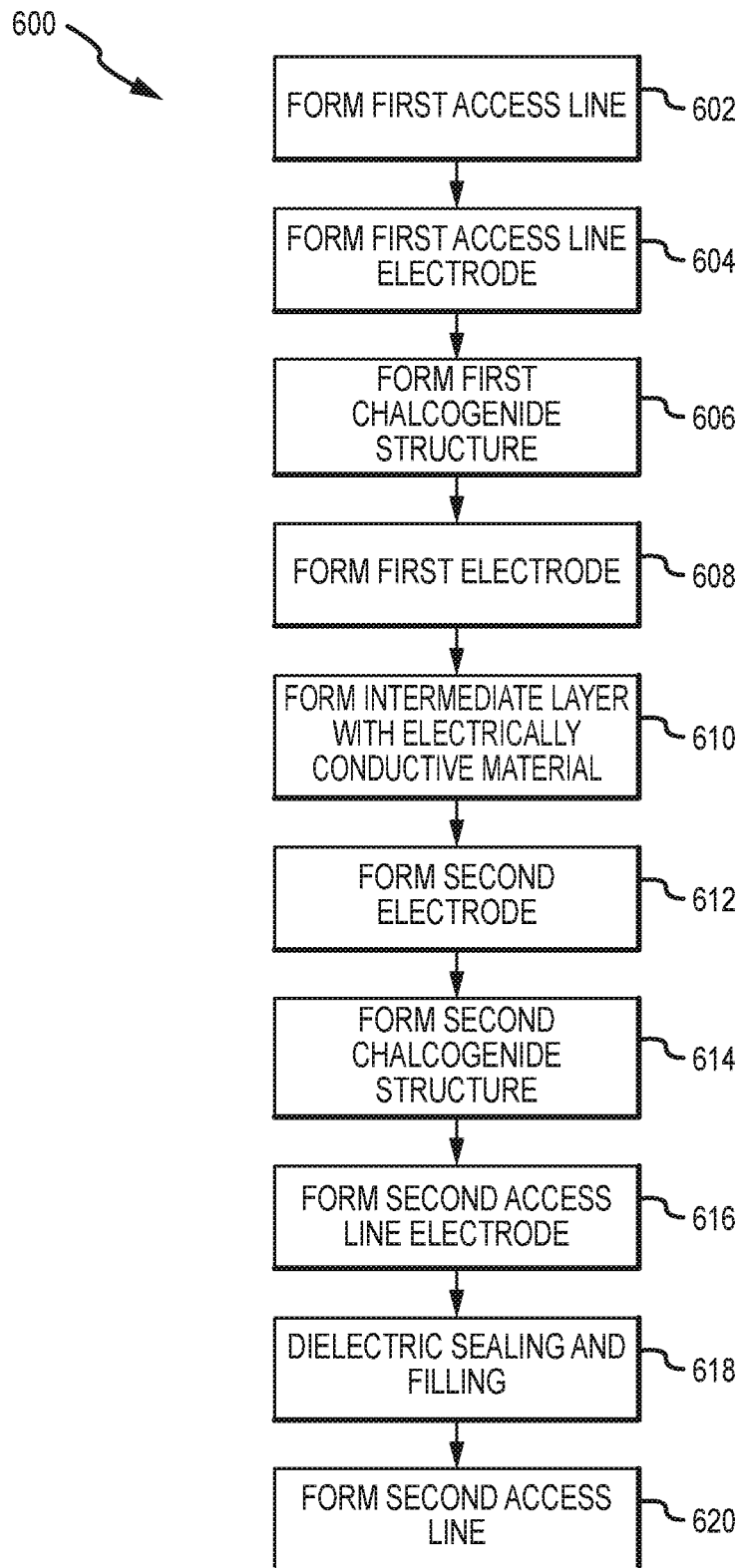
FIG. 6 is flow diagram of a method of manufacturing a phase change memory cell according to an embodiment of the present invention.

FIG. 6 illustrates a method 600 of manufacturing one or more phase change memory cells according to an embodiment of the invention. The method 600 may be used to manufacture the memory cells 220, 320, 420, 520 illustrated herein, or other similar memory cells.

In operation 602, a first access line (e.g., a word line) may be formed, and in operation 604, a first access line electrode may be formed over the first access line. In operation 606, a switch (e.g., a first chalcogenide structure) may be formed over the first access line electrode, and in operation 608 a first electrode portion may be formed over the switch. In operation 610 an electrically conductive barrier material may be formed over the first electrode portion. In operation 612 a second electrode portion may be formed over the electrically conductive barrier material, and in operation 614 a phase change device (e.g., a second chalcogenide structure) may be formed over the second electrode portion. In operation 616, a second access line electrode may be formed over the phase change device, and in operation 618, the memory cells may be dielectrically sealed and filled. In operation 620, a second access line may be formed over the second access line electrode.

Referring to the operations 602-620 of the method 600, any suitable manufacturing method may be used to form the various components. For example, the electrodes or electrode portions may be formed by deposition of materials, including physical vapor deposition (PVD), atomic layer depositions (ALD), chemical vapor deposition (CVD), sputtering, and so forth. Similarly, the electrically conductive barrier material may be formed in any relevant manner, including PVD, ALD, CVD, sputtering, and so forth. As mentioned above, in some examples, one or more of the operations 602-620 may done in situ with one another. For example, if the electrically conductive barrier material is Si, it may be formed in situ with the phase change device so as to prevent the Si from oxidizing during, for example, an air break. Alternatively, a short air break may be taken during which little or no oxide forms, and any oxide formed may be removed by a subsequent process in some examples. In other examples, such as where two discontinuous portions of electrically conductive TiN are used, there may be an air break in between the forming by deposition or other means of the two TiN portions so as to further impede the formation of columnar structures. In some embodiments, one or more of the operations 602-620 may be performed using, for example, photolithographic patterning of components of individual memory cells.

Figure 7:
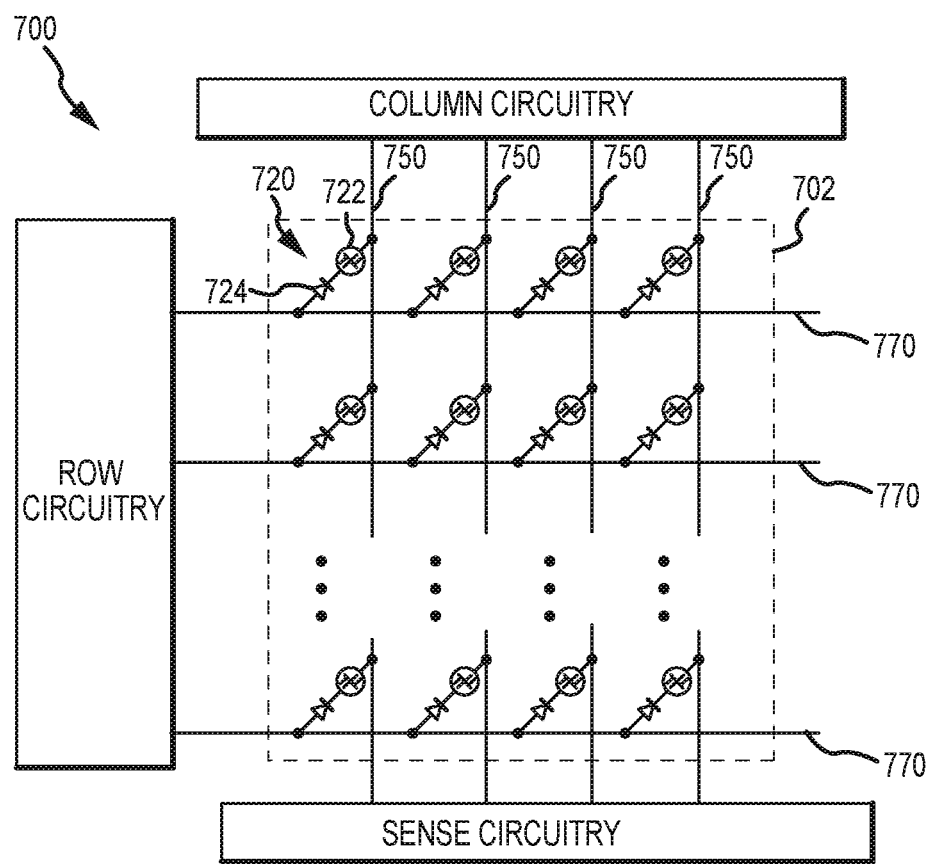
FIG. 7 is a block diagram of a memory according to an embodiment of the invention.

FIG. 7 illustrates a portion of a memory 700 according to an embodiment of the present invention. The memory 700 includes an array 702 having a plurality of cells 720 (e.g., PCM cells). Each of the cells 720 includes a phase change device 722 and a switch 724: a phase change storage element 722 configured to store one or more bits of data, and a switch 724 configured to allow data to be selectively read from or programmed in the storage element 722. Each cell 720 is electrically coupled to a respective bit line 750 and a respective word line 770, and is located at the crossing of the respective bit line 750 and word line 770 for the cell 720. Each cell 720 may be addressable by selection of the associated bit line 750 and word line 770. The switch 724 may be a selectable diode or an ovonic threshold switch, as described above with reference to FIGS. 2 through 6 in some embodiments. As illustrated in FIG. 7, the cells 720 are grouped in subsets of four cells in the direction of the word lines 770. In other embodiments, other subset sizes may be used, such as subsets having 8, 16, or 32 cells. In general, the memory cells 720 may be any of the memory cells 220, 320, 420, 520 described above, or similar memory cells, and may in some embodiments be manufactured using the method 600 illustrated in FIG. 6 (or other, similar method) in some embodiments. While the memory cells 720 are typically uniform across the array 702, in some embodiments, different types and structures of memory cells 720 may be used within a single array 702.

The array 702 may be a 3D array, with cross-point decks, such as those shown in FIG. 1 through 5, super positioned over one another in a 3D cross point memory. Alternatively, the array 702 may be a vertical stack of 2D arrays in order to obtain a 3D array.

To program a cell 720, a programming voltage, e.g., a voltage greater than a threshold voltage of switch 724, is provided to the switch 724 via the respective word line 770. An inhibition voltage, e.g., a bit line programming voltage, may be provided to the other, unaddressed word lines 770, thereby preventing a phase state change in the other storage elements 722. In other examples, the cells may be programmed by biasing the respective bit lines 750 with a programming voltage and providing an inhibition voltage (e.g., a word line programming voltage) to the other unaddressed bit lines 750. In this manner, any number of cells on a respective word line 770 may be simultaneously addressed in some embodiments.

When a cell 720 is programmed, an electrical current flows through the addressed cell, thereby heating local chalcogenic material at or above a melting temperature of the material. The chalcogenic material is then allowed to cool under controlled conditions such that the desired state of the cell is achieved. More precisely, rapid cooling may place the material in the amorphous state that may, for instance, correspond to a binary 0. Conversely, slower cooling may place the material in the crystalline state that may, for instance, correspond to a binary 1. Intermediate states may be achieved by cooling the material at rates interpolated between the rates for cooling used for placing the material in the amorphous and crystalline states. In some embodiments, heating the chalcogenic material at a temperature lower than the melting temperature for a particular period of time may place the material in the crystalline state. Thus, in some instances, a cell 720 may be programmed by setting the amplitude and pulse width of the current or voltage provided to the cell 720 through the word line 770 and bit line 750.

From the foregoing it will be appreciated that, although specific embodiments of the invention have been described herein for purposes of illustration, various modifications may be made without deviating from the spirit and scope of the invention. Accordingly, the invention is not limited to the specific embodiments of the invention described herein. For example, FIGS. 2, 3, 4, and 5 illustrate various embodiments of memory cells 220, 320, 420, 520. However, other embodiments of memory cells may be used, which are not limited to having the same design, and may be of different designs and include different structure and operation from the structure and operation of the embodiments illustrated in and described with reference to these figures. For example, as mentioned above, the overall thickness of the electrode portions and electrically conductive barrier material(s) disposed between the phase change device and the switch may vary according to the particular implementation of a memory cell.

For example, in some embodiments, and with reference back to FIG. 2, if the resistance per unit thickness of the electrically conductive barrier material 240 is approximately the same as the resistance per unit thickness of the first and second electrode portions 230a, 230b, the overall thickness of the first and second electrode portions 230a, 230b together with the electrically conductive barrier material 240 in FIG. 2 may be approximately the same thickness as the single electrode illustrated in FIG. 1. In other embodiments, if for example the resistance per unit thickness of the electrically conductive barrier material 240 is less than the resistance per unit thickness of the first and second electrode portions 230a, 230b, the overall thickness of the first and second electrode portions 230a, 230b together with the electrically conductive barrier material 240 in FIG. 2 may be greater than the thickness as the single electrode illustrated in FIG. 1 because the first and second electrode portions 230a, 230b may be thicker in order to maintain an overall resistance comparable to the electrode 130 illustrated in FIG. 1. In still other embodiments, if the resistance per unit thickness of the electrically conductive barrier material 240 is greater than the resistance per unit thickness of the first and second electrode portions 230a, 230b, the overall thickness of the first and second electrode portions 230a, 230b together with the electrically conductive barrier material 240 in FIG. 2 may be less than the thickness as the single electrode illustrated in FIG. 1 because the first and second electrode portions 230a, 230b may be thinner in order to maintain an overall resistance comparable to the electrode 130 illustrated in FIG. 1. In general, the number and thickness of the electrode portions and portions of electrically conductive barrier material disposed between the phase change device and the switch may greatly vary from one embodiment to the next.

What is claimed is:

1. An apparatus, comprising:
    a first chalcogenide structure;
    a second chalcogenide structure stacked together with the first chalcogenide structure;
    a first electrode coupled to the first chalcogenide structure;
    a second electrode coupled to the second chalcogenide structure; and
    an electrically conductive barrier material disposed between the first and second electrodes, wherein the electrically conductive barrier material is thicker than a combined thickness of the first and second electrodes.

2. The apparatus of claim 1, wherein the electrically conductive barrier material is amorphous.

3. The apparatus of claim 1, wherein the electrically conductive barrier material comprises at least one of titanium nitride or tungsten silicide.

4. The apparatus of claim 1, wherein the electrically conductive barrier material comprises silicon.

5. The apparatus of claim 1, wherein the first and second electrodes each comprise carbon.

6. The apparatus of claim 1, wherein the first chalcogenide structure comprises a switch and the second chalcogenide structure comprises a phase change memory storage element.

7. A memory cell, comprising:
    a phase change device configured to store one or more bits of data and coupled to a first electrode;
    an electrically conductive barrier material coupled to the first electrode and a second electrode, wherein the electrically conductive barrier material is thicker than 50 ångströms; and
    a switch integrally formed in the memory cell with the phase change device, the first electrode, the electrically conductive barrier material, and the second electrode.

8. The memory cell of claim 7, wherein the switch comprises a chalcogenide switch.

9. The memory cell of claim 7, wherein the electrically conductive barrier material is amorphous.

10. The memory cell of claim 7, wherein the first electrode is between approximately 5 and 50 ångströms in thickness, and wherein the second electrode is between approximately 5 and 50 ångströms in thickness.

11. An apparatus, comprising:
    a phase change device configured to store one or more bits of data and coupled to a first electrode;
    an electrically conductive barrier material coupled to the first electrode and a second electrode; and
    a switch integrally formed with the phase change device, the first electrode, the electrically conductive barrier material, and the second electrode, wherein the switch is coupled to the second electrode.

12. The apparatus of claim 11, wherein the electrically conductive barrier material is thicker than 50 ångströms.

13. The apparatus of claim 11, wherein the electrically conductive barrier material is thicker than a combined thickness of the first electrode and the second electrode.

14. The apparatus of claim 11, wherein the first electrode is disposed between the phase change device and the electrically conductive barrier material, wherein the second electrode is disposed between the switch and the electrically conductive barrier material.

15. The apparatus of claim 11, wherein the first and second electrodes are substantially not thermally conductive.

16. The apparatus of claim 11, further comprising:
    a first access line electrode coupled to the phase change device; and
    a second access line electrode coupled to the switch.

17. The apparatus of claim 16, further comprising:
    a first access line coupled to the first access line electrode; and
    a second access line coupled to the second access line electrode, wherein the first and second access lines are operable to select the one or more bits of data.

18. The apparatus of claim 11, wherein the switch comprises a chalcogenide switch.

19. The apparatus of claim 11, wherein a grain boundary of the electrically conductive barrier material does not line up with a grain boundary of the first electrode or the second electrode.

20. The apparatus of claim 11, wherein the electrically conductive barrier material is at least partially amorphous or at least partially crystalline.

* * * * *